(12) United States Patent
Mann et al.

(10) Patent No.: US 11,083,093 B2
(45) Date of Patent: Aug. 3, 2021

(54) OUTDOOR ELECTRONICS ENCLOSURE WITH MODULAR STRUCTURE

(71) Applicant: CommScope Technologies LLC, Hickory, NC (US)

(72) Inventors: Charles John Mann, Omaha, NE (US); Jiayong Wang, Shanghai (CN); Qiwei Shi, Shanghai (CN); Walter Mark Hendrix, Richardson, TX (US); Tri H. Nguyen, Richardson, TX (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/429,611

(22) Filed: Jun. 3, 2019

(65) Prior Publication Data

US 2020/0060027 A1 Feb. 20, 2020

Related U.S. Application Data

(60) Provisional application No. 62/718,459, filed on Aug. 14, 2018.

(51) Int. Cl.
*H05K 5/00* (2006.01)
*H05K 7/18* (2006.01)
(Continued)

(52) U.S. Cl.
CPC ........... *H05K 5/0008* (2013.01); *H05K 5/065* (2013.01); *H05K 7/183* (2013.01); *H05K 7/1488* (2013.01)

(58) Field of Classification Search
CPC ...... H05K 5/0008; H05K 5/065; H05K 7/183; H05K 7/1488; H05K 7/186; H05K 7/20; H05K 7/14
See application file for complete search history.

(56) References Cited

U.S. PATENT DOCUMENTS 2,658,101 A * 11/1953 Coxe, Jr. ................ H04B 1/082
174/51
4,426,935 A * 1/1984 Nikoden, Jr. .......... A47B 47/03
109/79
(Continued)

FOREIGN PATENT DOCUMENTS

JP 06-79180 11/1994
JP 08-08547 1/1996
(Continued)

OTHER PUBLICATIONS

Translation of JP 679180 (Year: 1994).*
(Continued)

*Primary Examiner* — Hung S. Bui
*Assistant Examiner* — Sagar Shrestha
(74) *Attorney, Agent, or Firm* — Myers Bigel, P.A.

(57) ABSTRACT

A modular electronics enclosure includes a rear frame, a first L-shaped piece and a second L-shaped piece joined to form a box-shaped shell having a floor, a ceiling, a rear wall and first and second opposed side walls that define an internal cavity. The first L-shaped piece includes a wall panel and a top panel that form the ceiling and the first side wall of the shell. The second L-shaped piece includes a wall panel and a bottom panel that form the floor and the second side wall of the shell. The rear frame forms the rear wall of the shell.

15 Claims, 9 Drawing Sheets

(51) Int. Cl.
*H05K 5/06* (2006.01)
*H05K 7/14* (2006.01)

(56) References Cited

U.S. PATENT DOCUMENTS

| | | | | |
|---|---|---|---|---|
| 6,145,683 A * | 11/2000 | Taniguchi | ............ | H05K 5/0021 220/4.02 |
| 2006/0108899 A1 * | 5/2006 | Jin | ............ | A47B 47/042 312/257.1 |
| 2006/0262508 A1 * | 11/2006 | Chen | ............ | G06F 1/181 361/724 |
| 2007/0278915 A1 * | 12/2007 | Conrardy | ............ | H01M 2/1077 312/257.1 |
| 2008/0164794 A1 * | 7/2008 | Lai | ............ | H05K 7/1488 312/298 |
| 2008/0265586 A1 * | 10/2008 | Like | ............ | H05K 7/20518 290/38 R |
| 2009/0185346 A1 * | 7/2009 | Cairo | ............ | H05K 7/20127 361/692 |
| 2009/0307983 A1 * | 12/2009 | Nelson | ............ | H04Q 1/026 49/479.1 |
| 2010/0059270 A1 * | 3/2010 | Yeh | ............ | H05K 7/20136 174/547 |
| 2010/0116545 A1 * | 5/2010 | Lewison | ............ | H05K 5/04 174/520 |
| 2013/0187522 A1 * | 7/2013 | Campagna | ............ | H05K 5/02 312/223.1 |
| 2013/0221086 A1 * | 8/2013 | Holdman | ............ | G06K 5/04 235/375 |
| 2015/0101862 A1 * | 4/2015 | Shiraki | ............ | H02G 3/088 174/563 |
| 2015/0136714 A1 * | 5/2015 | Franklin | ............ | H05K 7/18 211/26 |
| 2016/0238303 A1 * | 8/2016 | Olson | ............ | F25D 23/063 |
| 2017/0027072 A1 * | 1/2017 | Bhalla | ............ | H02B 1/306 |
| 2017/0048999 A1 * | 2/2017 | Abee | ............ | H02B 1/28 |
| 2017/0280580 A1 | 9/2017 | Nguyen et al. | | |
| 2018/0235099 A1 * | 8/2018 | Dane | ............ | H05K 7/1458 |
| 2019/0281712 A1 * | 9/2019 | Cheng | ............ | H05K 5/0013 |

FOREIGN PATENT DOCUMENTS

| | | |
|---|---|---|
| JP | 2004006546 | 1/2004 |
| JP | 2009158649 | 7/2009 |

OTHER PUBLICATIONS

International Search Report and Written Opinion corresponding to International Application No. PCT/US2019/043335 dated Nov. 13, 2019.

"International Preliminary Report on Patentability corresponding to International Application No. PCT/US2019/043335 dated Feb. 25, 2021".

* cited by examiner

OUTDOOR ELECTRONICS ENCLOSURE WITH MODULAR STRUCTURE

RELATED APPLICATION

The present application claims priority from and the benefit of U.S. Provisional Patent Application No. 62/718,459, filed Aug. 14, 2018, the disclosure of which is hereby incorporated herein in its entirety.

FIELD OF THE INVENTION

The present invention relates generally to cabinets, and more specifically to electronics cabinets.

BACKGROUND

Outdoor electronics cabinets have become popular in recent years. They can protect a wide range of electronic equipment including radios, multicarrier power amplifiers (MCPA), power supplies, batteries, and wireless cell site backhaul equipment. These cabinets can protect base station equipment from environmental conditions while minimizing operating expenses and energy consumption.

Electronics cabinets are typically offered in a limited number of configurations and sizes. It may be desirable to provide cabinets in more varied configurations.

SUMMARY

As a first aspect, embodiments of the invention are directed to a modular electronics enclosure. The enclosure comprises: a rear frame, a first L-shaped piece and a second L-shaped piece joined to form a box-shaped shell having a floor, a ceiling, a rear wall and first and second opposed side walls that define an internal cavity. The first L-shaped piece includes a wall panel and a top panel that form the ceiling and the first side wall of the shell. The second L-shaped piece includes a wall panel and a bottom panel that form the floor and the second side wall of the shell. The rear frame forms the rear wall of the shell.

As a second aspect, embodiments of the invention are directed to a modular electronics enclosure comprising: a rear frame, a first L-shaped piece and a second L-shaped piece joined to form a box-shaped shell having a floor, a ceiling, a rear wall and first and second opposed side walls that define an internal cavity. The first L-shaped piece includes a wall panel and a top panel that form the ceiling and the first side wall of the shell. The second L-shaped piece includes a wall panel and a bottom panel that form the floor and the second side wall of the shell. The rear frame forms the rear wall of the shell. The first and second pieces and the rear frame are joined with fasteners that are located in the internal cavity of the shell.

DETAILED DESCRIPTION

The present invention is described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. It will also be appreciated that the embodiments disclosed herein can be combined in any way and/or combination to provide many additional embodiments.

Unless otherwise defined, all technical and scientific terms that are used in this disclosure have the same meaning as commonly understood by one of ordinary skill in the art to which this invention belongs. The terminology used in the below description is for the purpose of describing particular embodiments only and is not intended to be limiting of the invention. As used in this disclosure, the singular forms "a", "an" and "the" are intended to include the plural forms as well, unless the context clearly indicates otherwise. It will also be understood that when an element (e.g., a device, circuit, etc.) is referred to as being "attached", "connected" or "coupled" to another element, it can be directly connected or coupled to the other element or intervening elements may be present. In contrast, when an element is referred to as being "directly attached", "directly connected" or "directly coupled" to another element, there are no intervening elements present.

In addition, spatially relative terms, such as "under", "below", "lower", "over", "upper", "top", "middle", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

Figure 1:
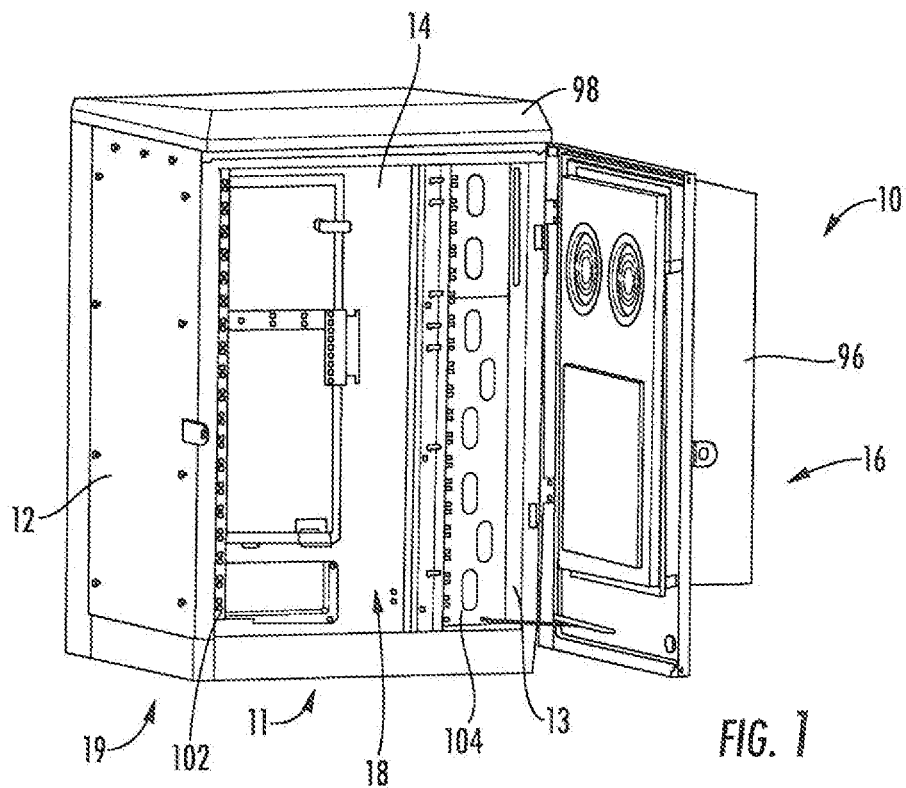
FIG. 1 is a front perspective view of a small cell modular cabinet according to embodiments of the invention, with the door in an open position.
Figure 2:
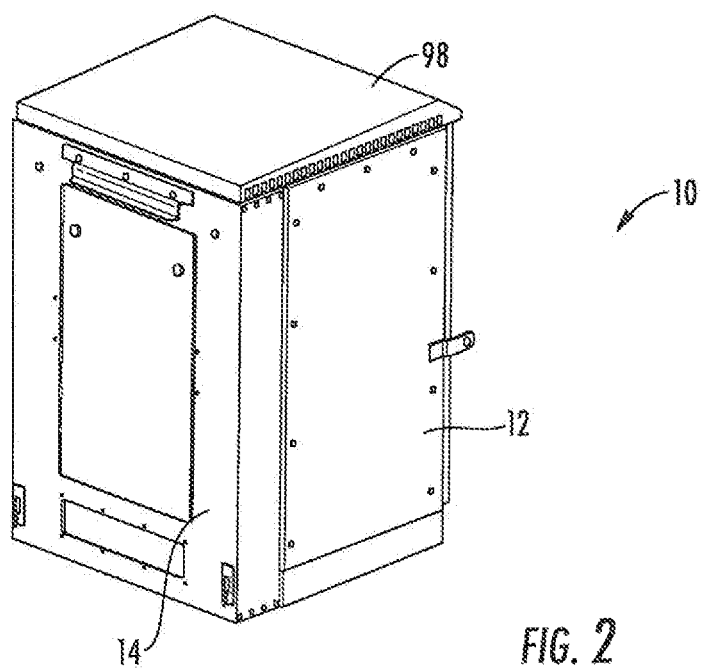
FIG. 2 is a rear perspective view of the cabinet of FIG. 1.
Figure 3:
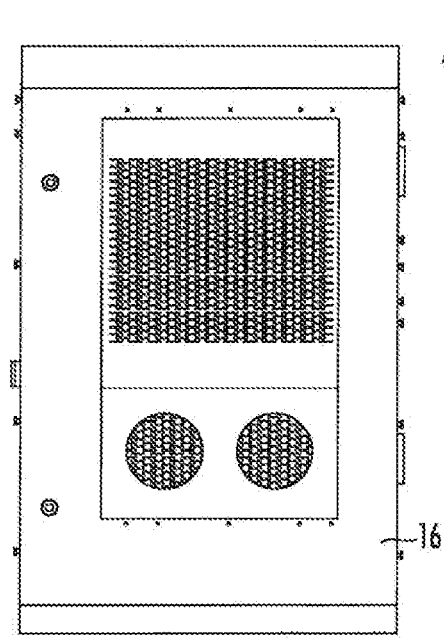
FIG. 3 is a front view of the cabinet of FIG. 1 with the door in a closed position.
Figure 4:
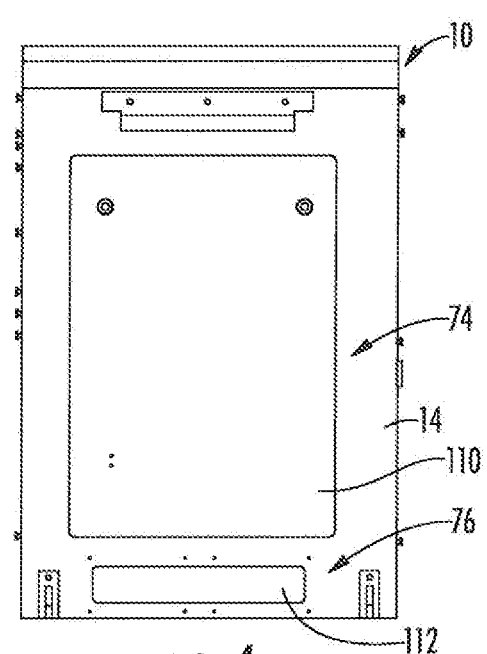
FIG. 4 is a rear view of the cabinet of FIG. 1.
Figure 5:
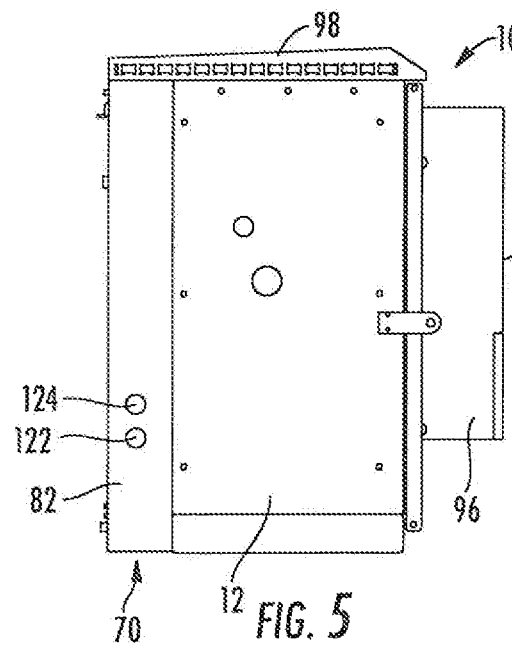
FIG. 5 is a right side view of the cabinet of FIG. 1 with the door in a closed position.
Figure 6:
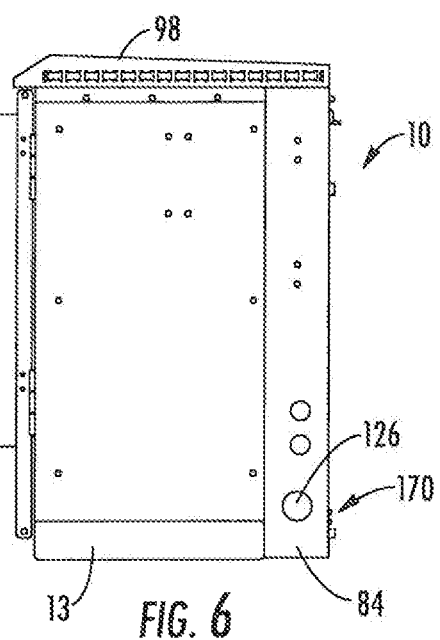
FIG. 6 is a left side view of the cabinet of FIG. 1 with the door in a closed position.
Figure 11:
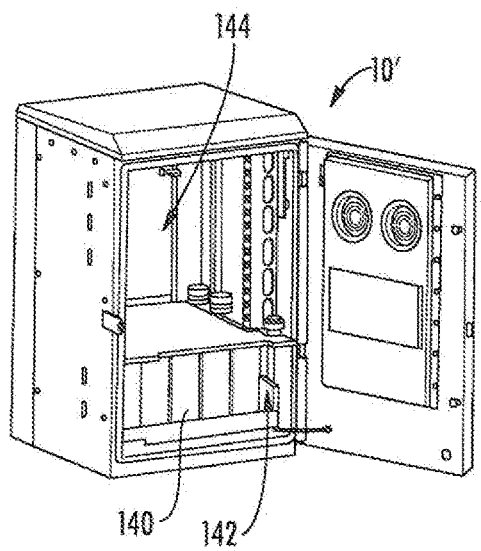
FIG. 11 is a front perspective view of a cabinet according to alternative embodiments of the invention with the door in the open position, wherein the cabinet is configured to store one battery string.

Referring now to the figures, a small cell modular cabinet, designated broadly at 10, is illustrated in FIGS. 1-10. The cabinet 10 has a generally box-shaped shell 19, with a floor 11, left and right side walls 12, 13, a rear wall 14, and a ceiling 15. A door 16 covers the front of the cabinet 10 but allows access to the internal cavity 18 of the cabinet 10. The door 16 is attached via a hinge 18 that allows it to pivot between an open position (as shown in FIGS. 1 and 11), in which the cavity 17 is accessible, and a closed position (as shown in FIGS. 5 and 6), in which the door 16 blocks access to the cavity 17 and thereby protects equipment (such as radios, multicarrier power amplifiers (MCPA), power supplies, and wireless cell site backhaul equipment) and batteries stored therein.

Figure 7:
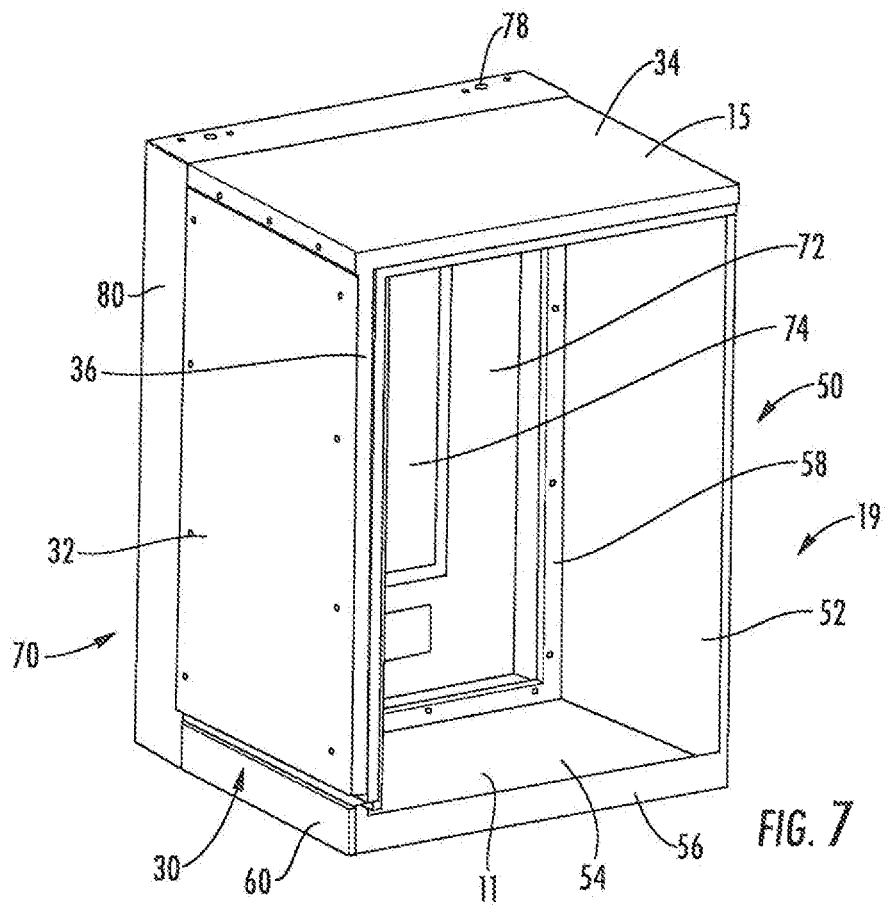
FIG. 7 is a front perspective view of the shell of the cabinet of FIG. 1.
Figure 8:
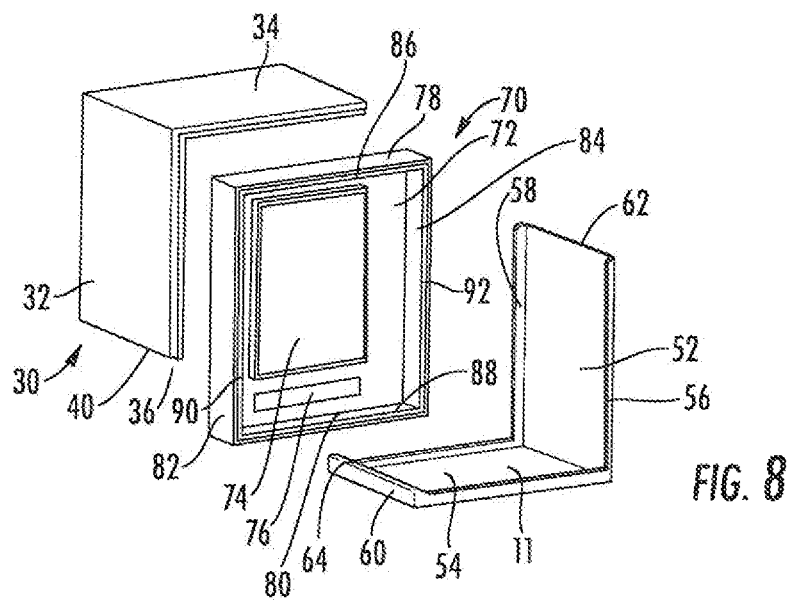
FIG. 8 is a front exploded perspective view of the shell of FIG. 7.

Referring to FIGS. 7 and 8, it can be seen that the shell 19 is formed of three different components: an L-shaped piece 30 that forms the ceiling 15 and the left side wall 12, a second L-shaped piece 50 that forms the floor 11 and the right side wall 13, and a back frame 70 that forms the rear wall 14. The piece 30 includes a wall panel 32 and a top panel 34. A front lip 36 extends perpendicularly from the front edges of the wall panel 32 and top panel 34 (see FIGS. 9 and 10). Similarly, a rear lip 38 extends perpendicularly from the rear edges of the wall panel 32 and top panel 34. A bottom lip 40 extends inwardly from the lower edge of the wall panel 32, and a top lip 42 extends downwardly from the right edge of the top panel 34. A flange 46 (FIGS. 7 and 10) extends inwardly from the lower edge of the top lip 42.

The piece 50 includes a wall panel 52 and a bottom panel 54. A front lip 56 extends perpendicularly from the front edges of the wall panel 52 and bottom panel 54. Similarly, a rear lip 58 extends perpendicularly from the rear edges of the wall panel 52 and bottom panel 54. A bottom lip 60 extends upwardly from the left edge of the bottom panel 54, and a top lip 62 extends inwardly from the upper edge of the wall panel 52. A flange 64 extends inwardly from the upper end of the bottom lip 60.

The back frame 70 includes a rear panel 72 that has a large cut-out 74 and a smaller cut-out 76. Top, bottom and side panels 78, 80, 82, 84 extend forwardly from the edges of the rear panel 72. Flanges 86, 88, 90, 92 project inwardly from the edges of the top, bottom and side panels 78, 80, 82, 84.

It can also be seen in FIG. 1 that a cap 98 may be attached to the shell 19 to cover the top panel 34. The cap 98 may be slightly sloped as shown to facilitate the draining of rainwater and/or other environmental agents that may land thereon.

Figures 9, 10:
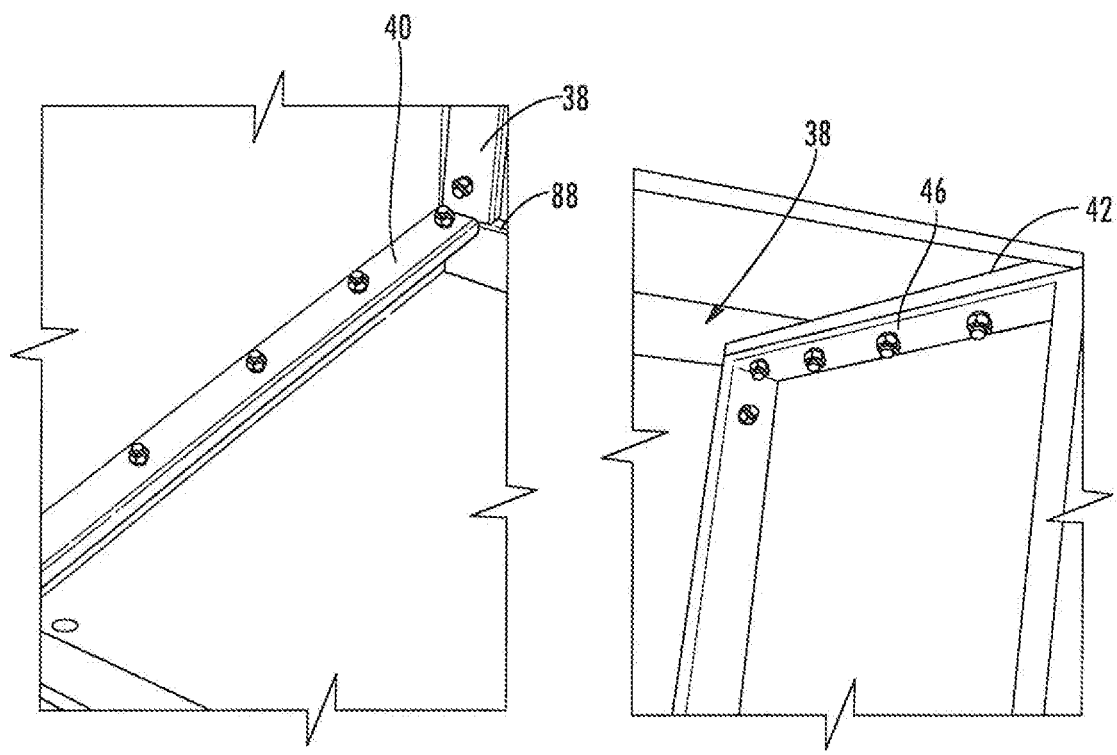
FIG. 9 is an internal enlarged perspective view of the joint between the left wall and the floor of the cabinet of FIG. 1.
FIG. 10 is an internal enlarged perspective view of the joints between the right wall, the rear wall and the ceiling of the cabinet of FIG. 1.

As can be seen in FIGS. 7 and 10, the pieces 30, 50 and the back frame 70 can be assembled into the shell 19 by abutting the respective lips and flanges and fastening them with screws or bolts inserted through holes in the lips and flanges. More specifically, the back frame 70 is attached to the piece 30 by fastening the flanges 86, 90 to the rear lip 38. The back frame 70 is attached to the piece 50 by fastening the flanges 88, 92 to the rear lip 58. The pieces 30, 50 are attached to each other by fastening the flange 64 to the bottom lip 40 and the top lip 62 to the flange 46 extending from the top lip 42 of the piece 30. Gaskets (which may be detachable or "pour in place" gaskets) may be interposed between some or all of these joints to provide a watertight seal to the shell 19. This arrangement enables the shell 19 to have no externally exposed fasteners, thereby improving security of the cabinet 10. The assembled cabinet 10 may be any size, but in some embodiments may have a cavity 17 that is 21 RU ("rack units, with each rack unit equal to about 1.75 inches) in height. In other embodiments, the cabinet may have a cavity that is equal to about 8, 14, 28 or 35 RU.

Also noteworthy is the sturdiness of construction. Conventional electronics cabinets employ a skeletal frame/lattice of beams and supports that serve as a foundation of the cabinet. Thin panels are attached to the beams to provide an enclosed shell. Thus, numerous parts (and attendant labor) are typically required to construct the shell, with the strength and rigidity of the shell provided largely by the skeletal frame. In contrast, the shell 19 comprises only three major components apart from fasteners: the pieces 30, 50 and the back frame 70. In particular, the configuration of the back frame 70, with its top, bottom and side panels 78, 80, 82, 84 being disposed generally perpendicularly to the rear panel 72, imbue the back frame 70 with considerable strength and rigidity. As a result, the shell 19 can be constructed from the pieces 30, 50 and rear frame 70 alone, without an underlying skeletal frame.

As noted above, the door 16 is attached to the shell 19 via a hinge 18, which can be of conventional construction. In many instances, a cooling unit 96 is mounted on the door 16. The cooling unit 96 may be passive (e.g., directed vents) or active (e.g., fans or air conditioning) as desired or needed. The cooling unit 96 shown in FIG. 1 is a heat exchanger.

Figures 13, 14, 15:
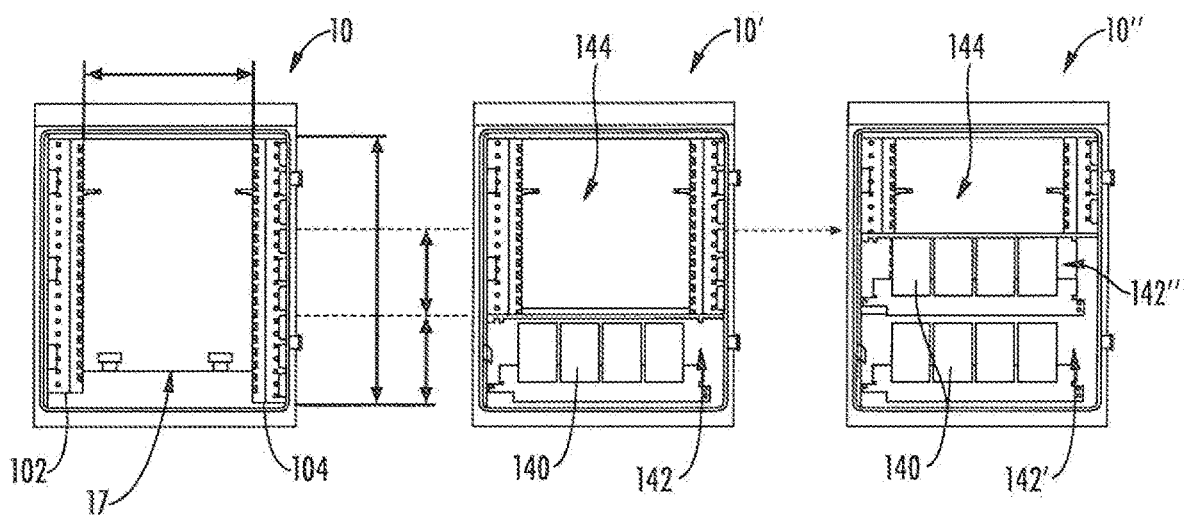
FIG. 13 is a front view of the cabinet of FIG. 1.
FIG. 14 is a front view of the cabinet of FIG. 11.
FIG. 15 is a front view of the cabinet of FIG. 12.
Figure 19:
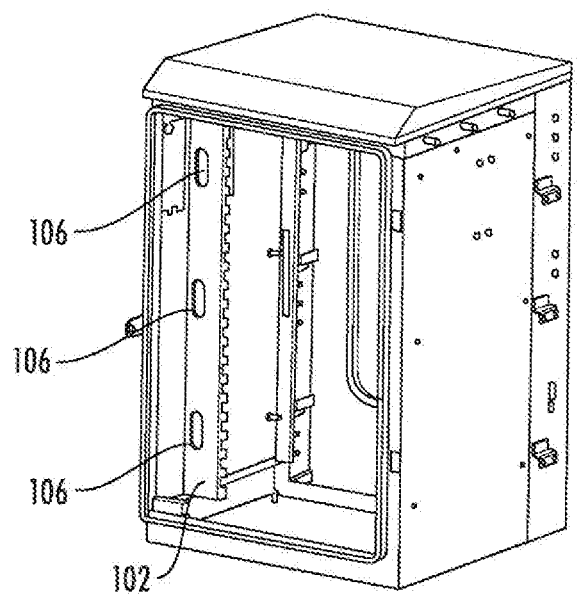
FIG. 19 is a left perspective view of the cabinet of FIG. 1 showing one equipment rack mounted to a side wall.

Referring to FIGS. 1 and 13, it can be seen that equipment racks 102, 104 may be mounted within the cavity 17; the racks 102, 104 are typically mounted via fasteners inserted through apertures in the wall panels 32, 52 of the pieces 30, 50. The racks 102, 104 may be configured in any manner known to those of skill in this art. In some embodiments, the racks 102, 104 may have the capability to mount equipment that is either 19 or 23 inches in width; exemplary racks that provide this capability are discussed in U.S. Patent Publication No. 2017/0280580 to Mann, filed Mar. 21, 2017, the disclosure of which is hereby incorporated herein. The racks 102, 104 may be single integrated components as shown in FIGS. 1 and 13, or may be divided into shorter units (e.g., one-third or two-thirds of the height of the shell 19) to facilitate the division of the cabinet 10 into compartments (see discussion below). In some embodiments, the racks 102, 104 may be 21 RU in height to match the cabinet 10, or may be divided into 7 RU units to enable the cavity 17 of the cabinet 10 to be divided into three compartments. Also, in some embodiments the racks 102, 104 include apertures 106 through which cables and cords can be routed and/or organized (see FIG. 19).

Figure 18:
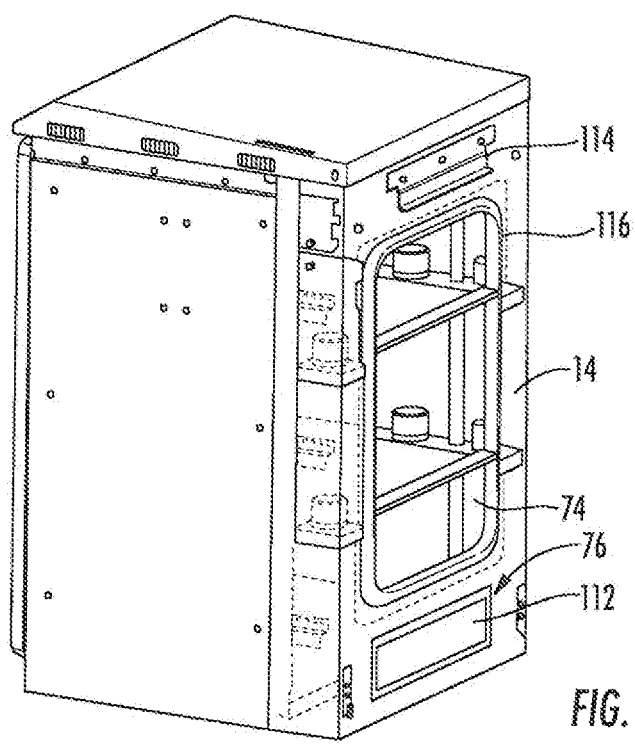
FIG. 18 is a rear perspective view of the cabinet of FIG. 1 with the upper I/O panel removed.

Referring now to FIGS. 4 and 18, the cutouts 74, 76 in the rear frame 70 are covered with input/output (I/O panels) 110, 112. These may be mounted in any number of ways, including quarter-turn latches and the like. A bracket 114 may also be attached to the rear surface of the rear panel 72. The bracket 114 may be used to facilitate pole mounting of the enclosure, and can alternatively be mounted to either side wall of the shell 19. The I/O panel 110 is removed in FIG. 18 so that a gasket 116 can be seen.

Referring now to FIGS. 5 and 6, the rear frame 70 also includes two circular apertures 122, 124 in the side panel 82, and another circular aperture 126 in the side panel 84. These apertures 122, 124, 126 provide potential pathways for cables entering and exiting the cabinet 10. For example, four to six 4-gauge cables may enter the cabinet 10 through the apertures 122, 124 and a 3 inch conduit containing as many as six cables may exit the cabinet 10 through the aperture 126.

Figure 12:
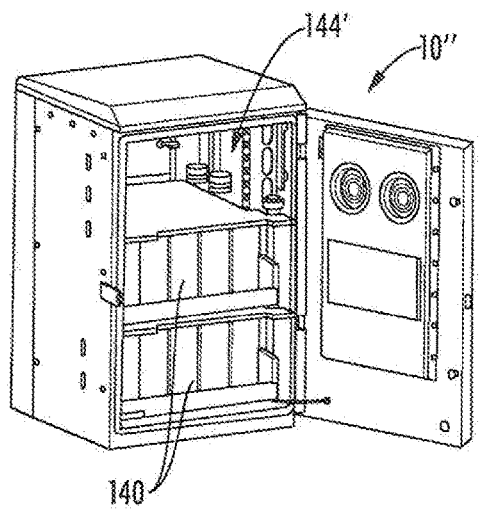
FIG. 12 is a front perspective view of a cabinet according to further embodiments of the invention with the door in the open position, wherein the cabinet is configured to store two battery strings.

Referring now to FIGS. 1 and 11-15, components within the cabinet 10 can be arranged in different ways, depending on need. The cabinet 10 shown in FIGS. 1 and 13 is arranged with racks 102, 104 extending the full height of the cabinet 10, such that the cavity 17 can be populated with electronic equipment mounted to the racks 102, 104, such as the aforementioned radios, multicarrier power amplifiers (MCPA), power supplies, and wireless cell site backhaul equipment. FIGS. 11 and 14 illustrate a cabinet 10' that includes a string of batteries 140 mounted within a compartment 142 that occupies the lower third of the cabinet 10', and further includes electronic equipment mounted in a compartment 144 that occupies the upper two-thirds of the cabinet 10'. FIGS. 12 and 15 illustrate a cabinet 10" that includes two strings of batteries 140 that occupy two compartments 142', 142" in the lower two-thirds of the cabinet 10" and electronic equipment in a compartment 144' that occupies the upper one-third of the cabinet 10".

Figure 16:
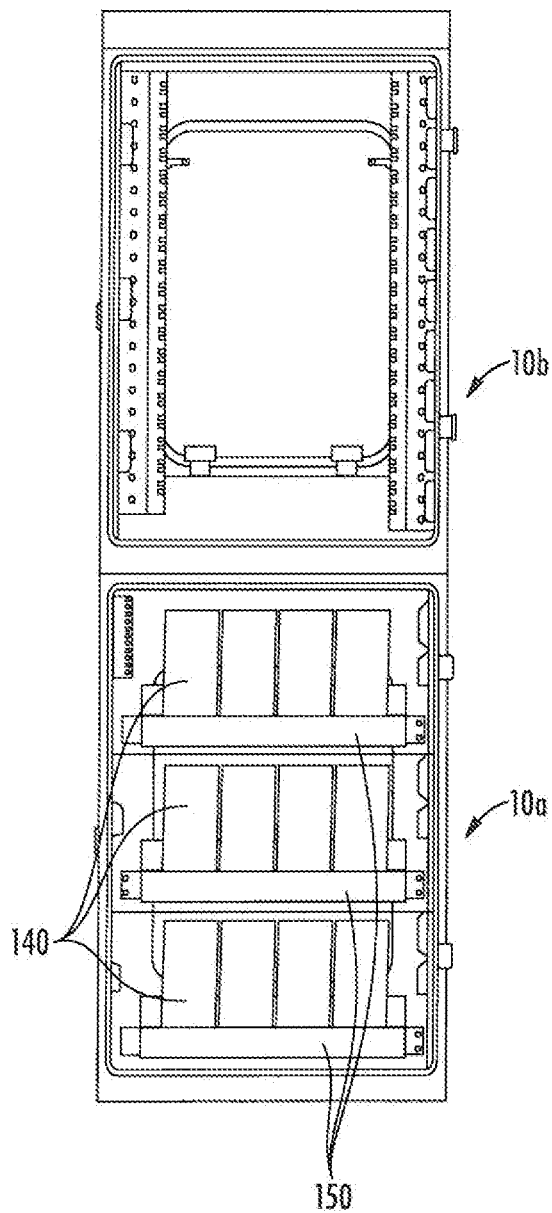
FIG. 16 is a front view of a cabinet assembly that comprises two shells of FIG. 7, with one shell containing three battery strings and the other containing racks for equipment.
Figure 17:
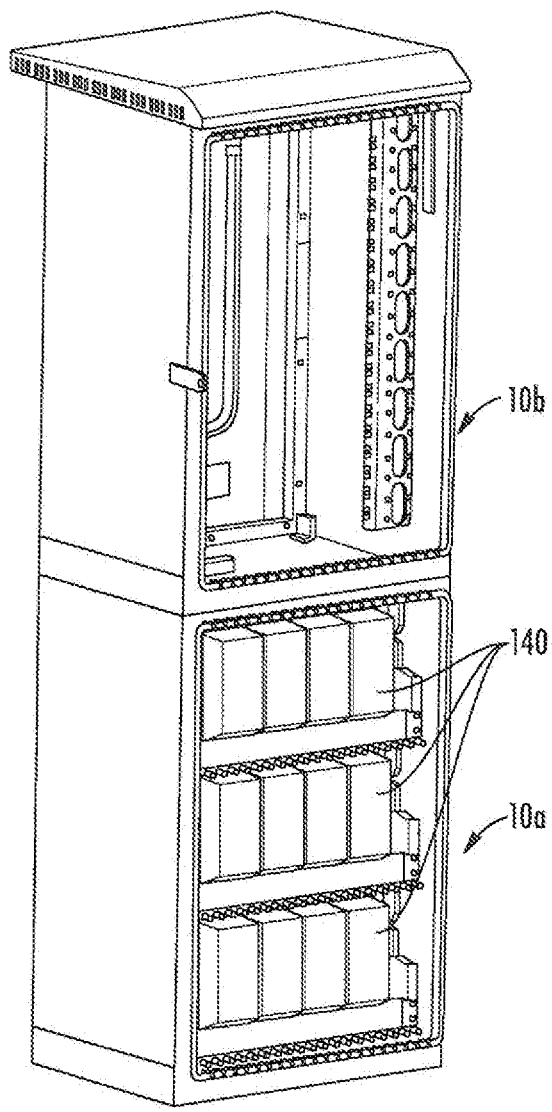
FIG. 17 is a front perspective view of the cabinet assembly of FIG. 16.

FIGS. 16 and 17 illustrate another alternative configuration that includes a first cabinet 10a stacked underneath a second cabinet 10b. The lower cabinet 10a is similar to the cabinet 10 illustrated above, but lacks the cap 98, and is filled with three battery strings 140. The upper cabinet 10b is mounted onto the ceiling of the lower cabinet 10a to form an integrated cabinet assembly.

Figure 20:
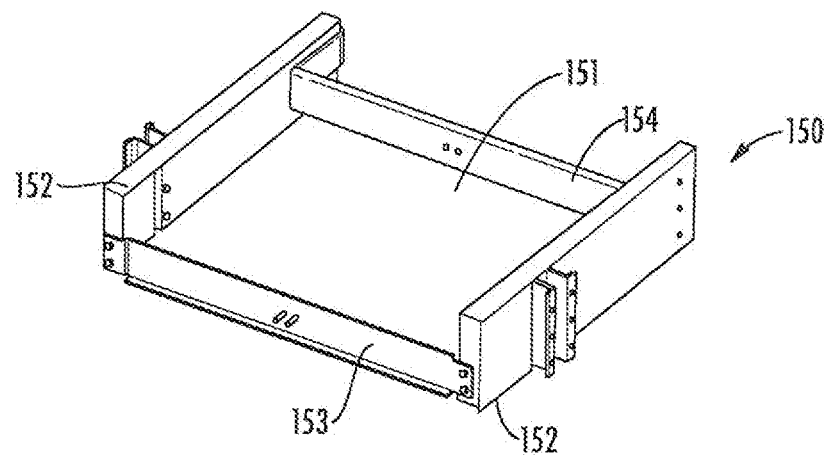
FIG. 20 is a perspective view of a battery tray used to support batteries in the cabinet of FIG. 11.
Figure 21:
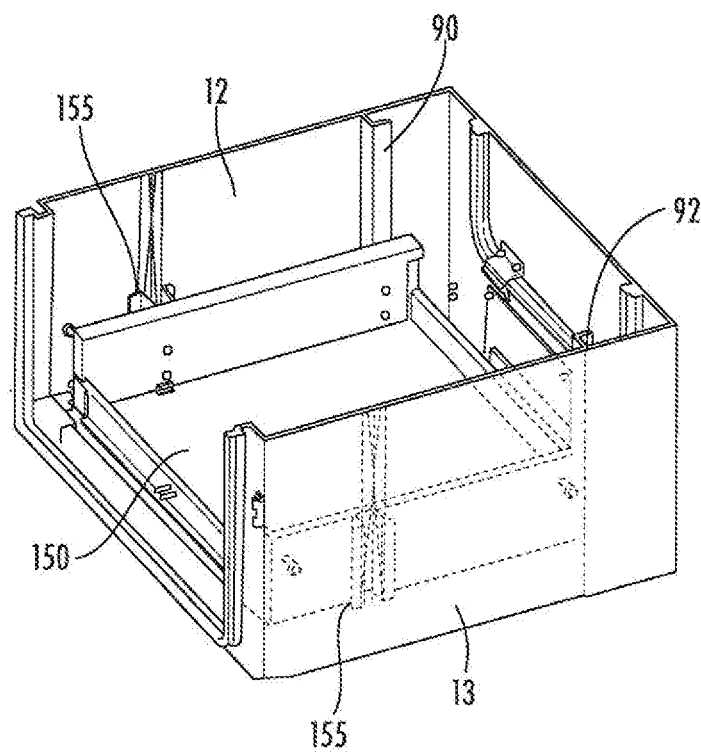
FIG. 21 is a perspective view of the battery tray of FIG. 20 installed within a cabinet of FIG. 1.

Referring now to FIGS. 20 and 21, the cabinets discussed herein may include a battery tray 150 that supports a string of batteries (such as that shown at 140 in FIG. 13). The battery tray 150 includes a floor 151, side walls 152, a front rail 153 and a rear rail 154. Batteries can be arranged between the side walls 152, the front rail 153 and the rear rail 154, supported by the floor 151. The battery tray 150 can be mounted to the side walls 12, 13 of the cabinet 10 via brackets 155 that are mounted via fasteners inserted into the holes for the racks 102, 104, and via fasteners that join the rear portions of the side walls 152 to the flanges 90, 92 of the rear frame 70. Typically, a separate battery tray 150 is employed with each battery string 140 (see separate trays 150 for battery strings 140 in FIGS. 16 and 17).

Figure 22:
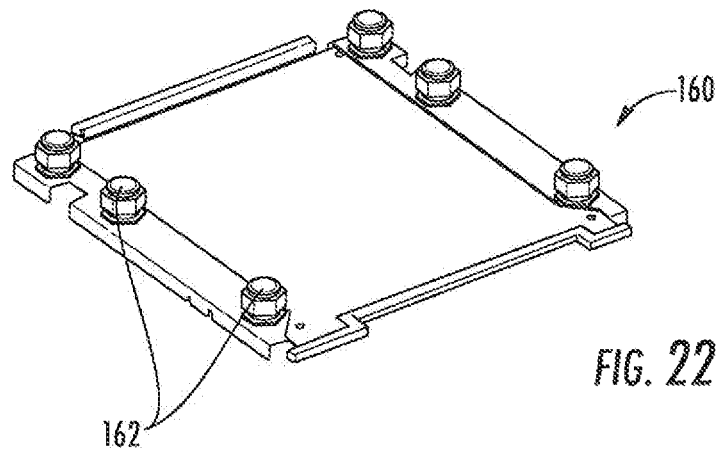
FIG. 22 is a perspective view of a divider panel for use in the cabinet of FIG. 1.
Figure 23:
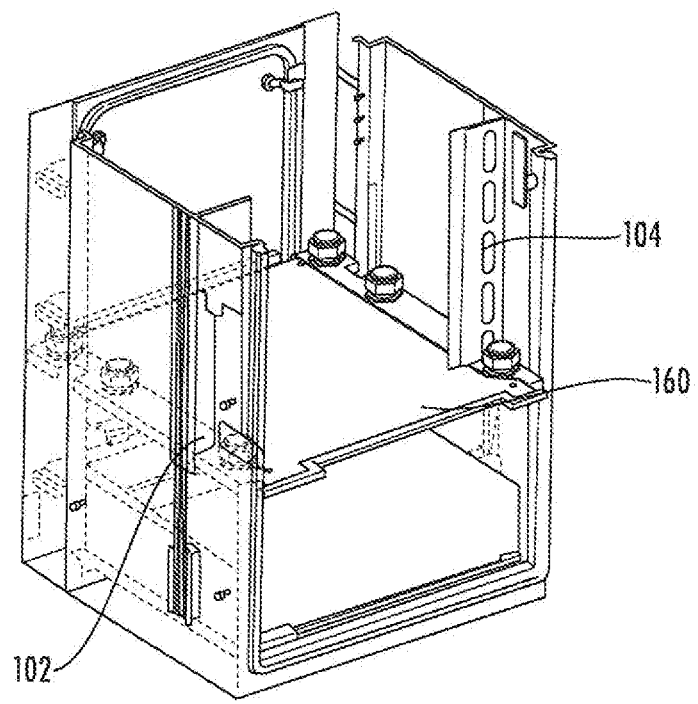
FIG. 23 is a perspective view of the divider panel of FIG. 22 installed in the cabinet of FIG. 1.

Referring now to FIGS. 22 and 23, any of the cabinets discussed herein may include one or more dividers 160 to separate the internal cavity thereof into compartments. The dividers 160 may be mounted between pieces of racks 102, 104, and may include glands 162 to permit the passage of cables between compartments. In some embodiments, particularly those with dividers 160, the cooling unit 96 may comprise two separate cooling units (e.g., two finned heat exchangers) that are separately operated and/or controlled; exemplary cooling units are discussed in U.S. Provisional Patent Application No. 62/550,886, filed Aug. 28, 2017, the disclosure of which is hereby incorporated herein by reference in its entirety.

Those of skill in this art will also appreciate that other configurations are also possible. For example, in some embodiments the back frame may be formed with greater depth, which may allow the storage of additional components (such as server racks and the like). As another example, one or both of the L-shaped pieces 30, 50 may be modified to permit the mounting of an air conditioner or other cooling unit on the side of the unit. Other possibilities are also contemplated.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A modular electronics enclosure, comprising:
   a rear frame, a first L-shaped piece and a second L-shaped piece joined to form a box-shaped shell having a floor, a ceiling, a rear wall, and first and second opposed side walls that define an internal cavity, a door, and a cooling unit;
   wherein the first L-shaped piece includes a first wall panel and a top panel that form the ceiling and the first side wall of the shell, wherein a first lip extends perpendicular from a front edge of the first wall panel and top panel, and wherein a second lip extends Perpendicular from a rear edge of the first wall panel and top panel;
   wherein the second L-shaped piece includes a second wall panel and a bottom panel that form the floor and the second side wall of the shell, wherein a third lip extends perpendicular from a front edge of the second wall panel and bottom panel, and wherein a fourth lip extends perpendicular from a rear edge of the second wall panel and bottom panel;
   wherein the rear frame forms the rear wall of the shell, wherein the rear frame comprises a rear panel with top, bottom and side panels extending forwardly from respective edges of the rear panel, and wherein first, second, third and fourth flanges project inwardly from respective edges of the rear frame top, bottom and side panels;
   wherein the second lip of the first L-shaped piece abuts and is joined to the first and third flanges of the rear frame, and wherein the fourth lip of the second L-shaped piece abuts and is joined to the second and fourth flanges of the rear frame;
   wherein the door hingedly attaches to one of the first or second wall panels of the first or second L-shaped pieces; and
   wherein the cooling unit is mounted to the door for cooling the internal cavity.

2. The modular electronics enclosure defined in claim 1, wherein the rear frame includes an opening covered by an I/O panel.

3. The modular electronics enclosure defined in claim 1, wherein at least one of the side panels of the rear frame includes an aperture for receiving a cable routed into the internal cavity.

4. The modular electronics enclosure defined in claim 1, further comprising a battery tray mounted in the internal cavity and a battery string residing in the battery tray.

5. The modular electronics enclosure defined in claim 1, further comprising a divider that divides the internal cavity into multiple compartments.

6. The modular electronics enclosure defined in claim 1, further comprising electronics equipment mounted in the internal cavity.

7. The modular electronics enclosure defined in claim 6, further comprising a battery string residing in the internal cavity.

8. The modular electronics enclosure defined in claim 1, wherein the internal cavity is nominally 21 RU in height.

9. An assembly, comprising first and second modular electronics enclosures, each of the first and second modular electronics enclosures comprising:
  a rear frame, a first L-shaped piece and a second L-shaped piece joined to form a box-shaped shell having a floor, a ceiling, a rear wall, first and second opposed side walls that define an internal cavity, a door, and a cooling unit;
  wherein the first L-shaped piece includes a first wall panel and a top panel that form the ceiling and the first side wall of the shell, wherein a first lip extends perpendicular from a front edge of the first wall panel and top panel, and wherein a second lip extends perpendicular from a rear edge of the first wall panel and top panel;
  wherein the second L-shaped piece includes a second wall panel and a bottom panel that form the floor and the second side wall of the shell, wherein a third lip extends Perpendicular from a front edge of the second wall panel and bottom panel, and wherein a fourth lip extends perpendicular from a rear edge of the second wall panel and bottom panel;
  wherein the rear frame forms the rear wall of the shell, wherein the rear frame comprises a rear panel with top, bottom and side panels extending forwardly from respective edges of the rear panel, and wherein first, second, third and fourth flanges project inwardly from respective edges of the rear frame top, bottom and side panels;
  wherein the second lip of the first L-shaped piece abuts and is joined to the first and third flanges of the rear frame, and wherein the fourth lip of the second L-shaped piece abuts and is joined to the second and fourth flanges of the rear frame;
  wherein the door hingedly attaches to one of the first or second wall panels of the first or second L-shaped pieces;
  wherein the cooling unit is mounted to the door for cooling the internal cavity; and wherein the second modular electronics enclosure is vertically stacked on and above the first electronics enclosure.

10. The assembly defined in claim 9, wherein the first modular electronics enclosure houses at least one battery string.

11. The assembly defined in claim 10, wherein the second modular electronics enclosure houses electronic equipment.

12. A modular electronics enclosure, comprising:
  a rear frame, a first L-shaped piece and a second L-shaped piece joined to form a box-shaped shell having a floor, a ceiling, a rear wall and first and second opposed side walls that define an internal cavity;
  wherein the first L-shaped piece includes a first wall panel and a top panel that form the ceiling and the first side wall of the shell, wherein a first lip extends perpendicular from a front edge of the first wall panel and top panel, and wherein a second lip extends perpendicular from a rear edge of the first wall panel and top panel;
  wherein the second L-shaped piece includes a second wall panel and a bottom panel that form the floor and the second side wall of the shell, wherein a third lip extends perpendicular from a front edge of the second wall panel and bottom panel, and wherein a fourth lip extends perpendicular from a rear edge of the second wall panel and bottom panel; and
  wherein the rear frame forms the rear wall of the shell, wherein the rear frame comprises a rear panel with top, bottom and side panels extending forwardly from respective edges of the rear panel, and wherein first, second, third and fourth flanges project inwardly from respective edges of the rear frame top, bottom and side panels; and
  wherein the second lip of the first L-shaped piece abuts and is joined to the first and third flanges of the rear frame with fasteners, and wherein the fourth lip of the second L-shaped piece abuts and is joined to the second and fourth flanges of the rear frame with fasteners, and wherein the fasteners are located in the internal cavity of the shell such that the shell has no externally exposed fasteners.

13. The modular electronics enclosure defined in claim 12, further comprising a door hingedly attached to one of the wall panels of the first or second pieces.

14. The modular electronics enclosure defined in claim 13, further comprising a cooling unit mounted to the door for cooling the internal cavity.

15. The modular electronics enclosure defined in claim 12, wherein the internal cavity is nominally 21 RU in height.

* * * * *